United States Patent
Lin et al.

(10) Patent No.: US 9,557,785 B2
(45) Date of Patent: Jan. 31, 2017

(54) COMPUTER DEVICE WITH HEAT-DISSIPATION CHANNELS

(71) Applicants: Inventec (Pudong) Technology Corporation, Shanghai (CN); INVENTEC CORPORATION, Taipei (TW)

(72) Inventors: Chun-Chi Lin, Taipei (TW); Feng-Ku Wang, Taipei (TW); Lung-Hsun Song, Taipei (TW); Chia-Cheng Shih, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 14/919,497

(22) Filed: Oct. 21, 2015

(65) Prior Publication Data

US 2016/0124473 A1 May 5, 2016

(30) Foreign Application Priority Data

Oct. 30, 2014 (CN) .......................... 2014 1 0598230

(51) Int. Cl.
| | |
|---|---|
| G06F 1/16 | (2006.01) |
| H05K 5/00 | (2006.01) |
| H05K 7/00 | (2006.01) |
| G06F 1/20 | (2006.01) |
| H05K 7/20 | (2006.01) |

(52) U.S. Cl.
CPC ............ *G06F 1/20* (2013.01); *H05K 7/20136* (2013.01)

(58) Field of Classification Search
CPC ............ G06F 1/20; G06F 1/203; G06F 1/206
USPC .......... 361/679.31, 679.32, 679.33, 679.46, 361/679.48, 679.49, 679.51; 165/110, 120, 157, 165/164, 185
See application file for complete search history.

(56) References Cited

U.S. PATENT DOCUMENTS

| | | | | |
|---|---|---|---|---|
| 5,460,441 A | * | 10/1995 | Hastings ................. | G06F 1/184 312/138.1 |
| 5,694,294 A | * | 12/1997 | Ohashi ................... | G06F 1/203 361/679.48 |
| 5,701,231 A | * | 12/1997 | Do ........................ | G06F 1/181 312/223.2 |
| 6,349,042 B1 | * | 2/2002 | Mills ..................... | G06F 1/181 165/121 |

(Continued)

*Primary Examiner* — Anthony Haughton
(74) *Attorney, Agent, or Firm* — Muncy, Geissler, Olds & Lowe, P.C.

(57) ABSTRACT

A computer device with at least one heat-dissipation channel includes a master unit and a peripheral unit. A case of the master unit includes a first connection surface including a first hole. The first hole communicates to an external space through a first heat-dissipation channel inside the master unit. A case of the peripheral unit includes a second connection surface including a second hole. The second hole communicates to the external space through a second heat-dissipation channel. A fan is located inside the second peripheral unit channel. When the first connection surface and the second connection surface are aligned to connect with each other, the first heat-dissipation channel, the first hole, the second hole and the second heat-dissipation channel are sequentially communicated in space to form an integrated heat-dissipation channel for guiding a cooling airflow driven by the fan to pass therethrough.

7 Claims, 4 Drawing Sheets

(56) References Cited

U.S. PATENT DOCUMENTS

| | | | | |
|---|---|---|---|---|
| 7,349,204 B2* | 3/2008 | Tanaka | ............. | G06F 1/181 |
| | | | | 361/679.33 |
| 7,881,062 B2* | 2/2011 | Chen | ............. | G06F 1/185 |
| | | | | 361/679.32 |
| 7,929,288 B1* | 4/2011 | Ma | ............. | H05K 7/20136 |
| | | | | 361/679.31 |
| 8,081,441 B2* | 12/2011 | Zhang | ............. | G11B 33/128 |
| | | | | 361/679.32 |
| 8,300,405 B2* | 10/2012 | Sun | ............. | G06F 1/20 |
| | | | | 165/185 |
| 8,537,538 B2* | 9/2013 | Kannler | ............. | G06F 1/183 |
| | | | | 361/679.33 |
| 8,837,138 B2* | 9/2014 | Wiltzius | ............. | G06F 1/20 |
| | | | | 361/679.46 |

\* cited by examiner

COMPUTER DEVICE WITH HEAT-DISSIPATION CHANNELS

This application claims the benefit of China Patent Application Serial No. 201410598230.2, filed Oct. 30, 2014, the subject matter of which is incorporated herein by reference.

BACKGROUND OF INVENTION

1. Field of the Invention

The invention relates to a computer device with heat-dissipation channels, and more particularly to the computer device with heat-dissipation channels that incorporates the master unit and the peripheral unit so as to achieve an assembly having plural channels for dissipating heat in between.

2. Description of the Prior Art

As the modern technology progresses, the trend in miniaturizing the products has incentivized the appearance of the computer device capable of joining plural peripheral units according to practical needs. Generally, the computer device with peripheral units includes a single master unit and a plurality of required peripheral units for function-extending purposes, such as the hard discs, the video graphics arrays (VGA) and so on. In an expanded computer device, the heat dissipation is one of crucial topics to be overcome. In the art, the master unit without fans is the mainstream design for the computer device. The accompanying heat-dissipation resort for such a master unit is the heat convection. However, after the master unit is expanded by a number of the peripheral units in a piling or stacking manner, the heat convection might not be enough for dissipating the heat generated by the master unit without fans and the peripheral units. Definitely, the resulted feat-dissipation problem forms an important issue for the popular master unit without fans.

SUMMARY OF THE INVENTION

Accordingly, in view of the notorious heat-dissipation problem for the master unit computer device expanded with a plurality of the peripheral units, it is the primary object of the present invention to provide a computer device with heat-dissipation channels that can form a plurality of heat-dissipation channels between the master unit and the peripheral units so as to help dissipate simultaneously the heat generated by the master unit and the peripheral units.

In the present invention, the computer device with heat-dissipation channels includes a master unit and at least one peripheral unit. The master unit further includes a main case and a first operation member. The main case further has at least one first connection surface including at least one first hole. At least one first heat-dissipation channel inside the main case communicates with an external space through the first hole. The first operation member is located inside the main case at a place in a midway of the first heat-dissipation channel. The peripheral unit further includes an peripheral-unit case and at least one fan. The peripheral-unit case further has at least one second connection surface including at least one second hole. At least one second heat-dissipation channel inside the peripheral-unit case communicates with the external space through the second hole. The fan is located inside the peripheral-unit case at a place in a midway of the second heat-dissipation channel. The second operation member located inside the peripheral-unit case is dissipated by the fan. When the peripheral unit is assembled to the master unit by having the first connection surface to neighbor the second connection surface, the first heat-dissipation channel, the first hole, the second hole and the second heat-dissipation channel are sequentially integrated as a whole to form an integrated heat-dissipation channel for a first cooling airflow driven by the fan to flow therethrough.

In one embodiment of the present invention, the main case further has at least one first heat-dissipation surface including one surface having at least one third hole. The third hole communicates with the first heat-dissipation channel. The first heat-dissipation surface is a lateral surface of the main case, and the first connection surface is a bottom surface of the main case. In addition, the peripheral-unit case further has at least one second heat-dissipation surface including at least one fourth hole. The fourth hole communicates with the second heat-dissipation channel. The second heat-dissipation surface is a lateral surface of the peripheral-unit case, and the second connection surface is a top surface of the peripheral-unit case.

In one embodiment of the present invention, the peripheral-unit case further has a third heat-dissipation surface including at least one fifth hole. At least one third heat-dissipation channel inside the peripheral-unit case communicates with the external space through the fifth hole. The third heat-dissipation channel communicates with the fourth hole. When the fan is operated, a second cooling airflow is generated to flow through the third heat-dissipation channel. In addition, the peripheral unit further has a second operation member located inside the peripheral-unit case by neighboring the fan. The first operation member can be a central processing unit (CPU) and the second operation member can be a graphics processing unit (GPU).

By providing the computer device with heat-dissipation channels in accordance with the present invention, since the fan can drive the cooling airflow to flow through the integrated heat-dissipation channel so as to dissipate the first operation member and the second operation member, the conventional heat-dissipation problem in the master unit and the peripheral unit can be well resolved.

In one embodiment of the present invention, since the fan can generate simultaneously another cooling airflow to flow through the third heat-dissipation channel so as to further dissipate the second operation member, thus the heat-dissipation efficiency upon the peripheral unit can be further enhanced.

All these objects are achieved by the computer device with heat-dissipation channels described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a computer device with heat-dissipation channels. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
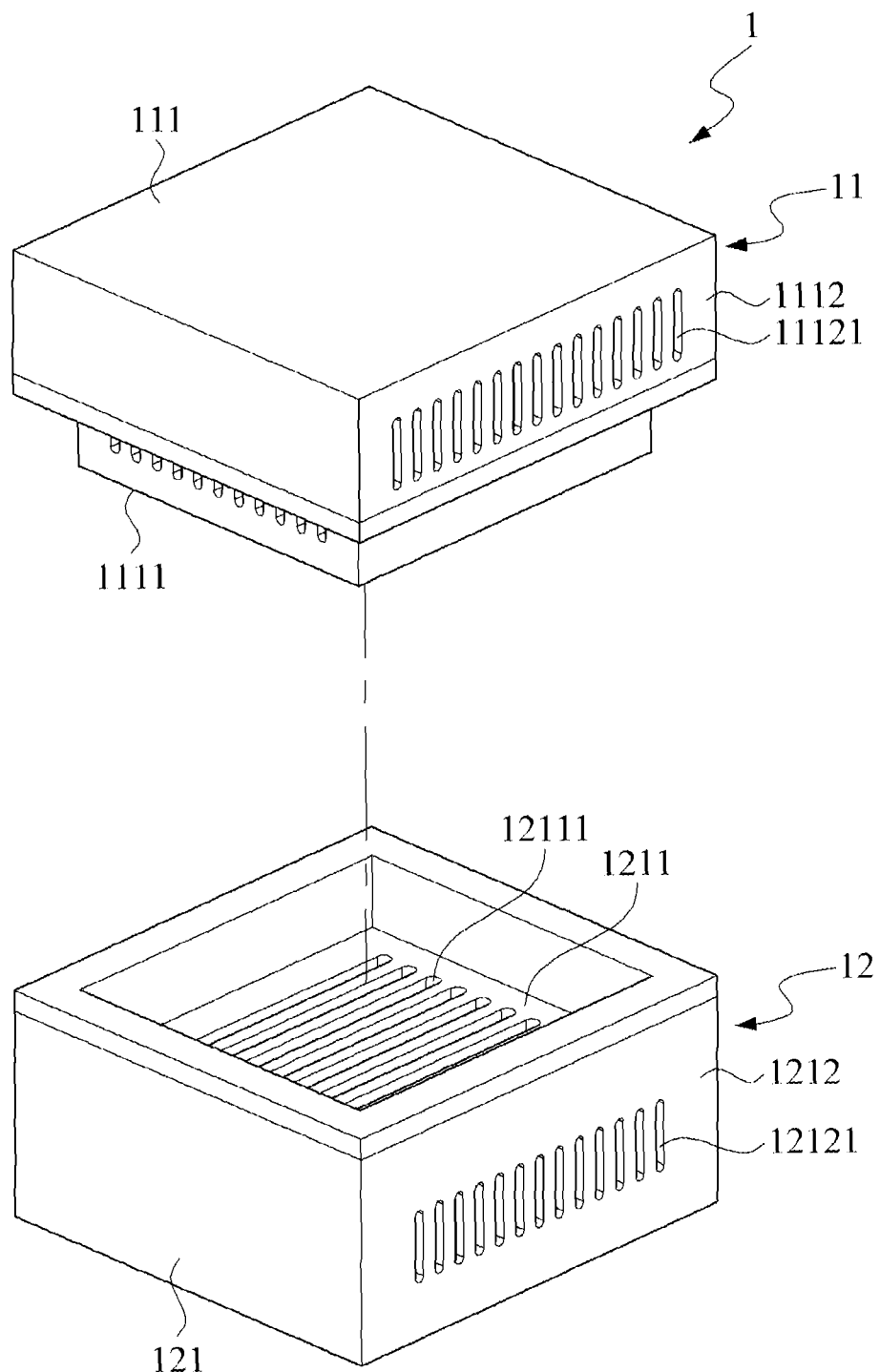
FIG. 1 is an exploded view at large of a first embodiment of the computer device with heat-dissipation channels in accordance with the present invention.
Figure 2:
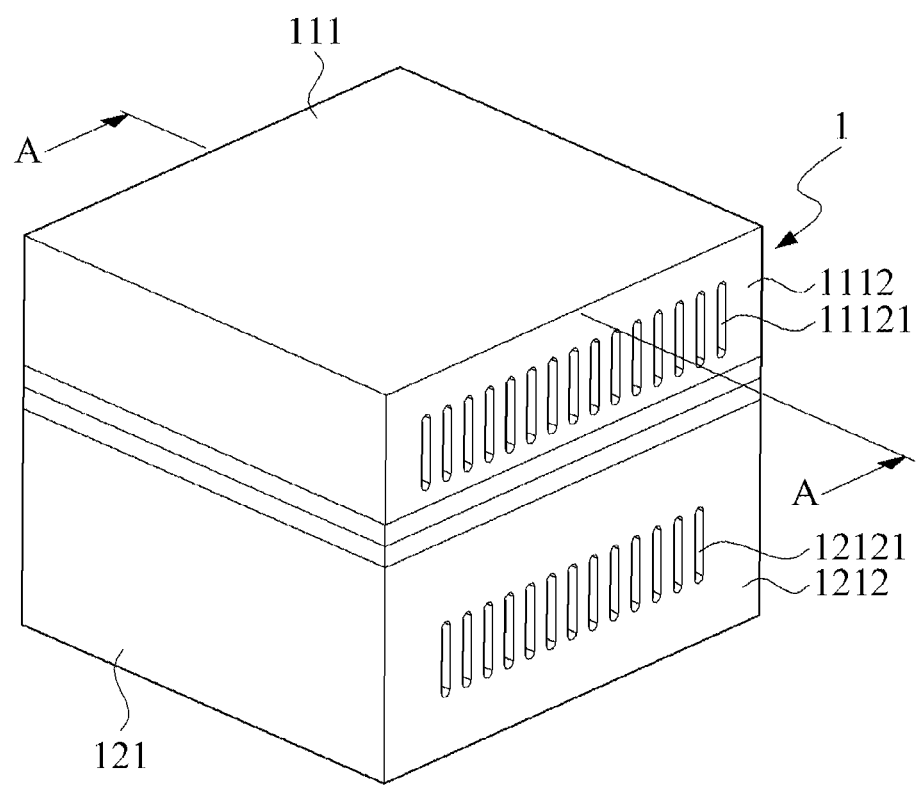
FIG. 2 is a perspective view of FIG. 1.
Figure 3:
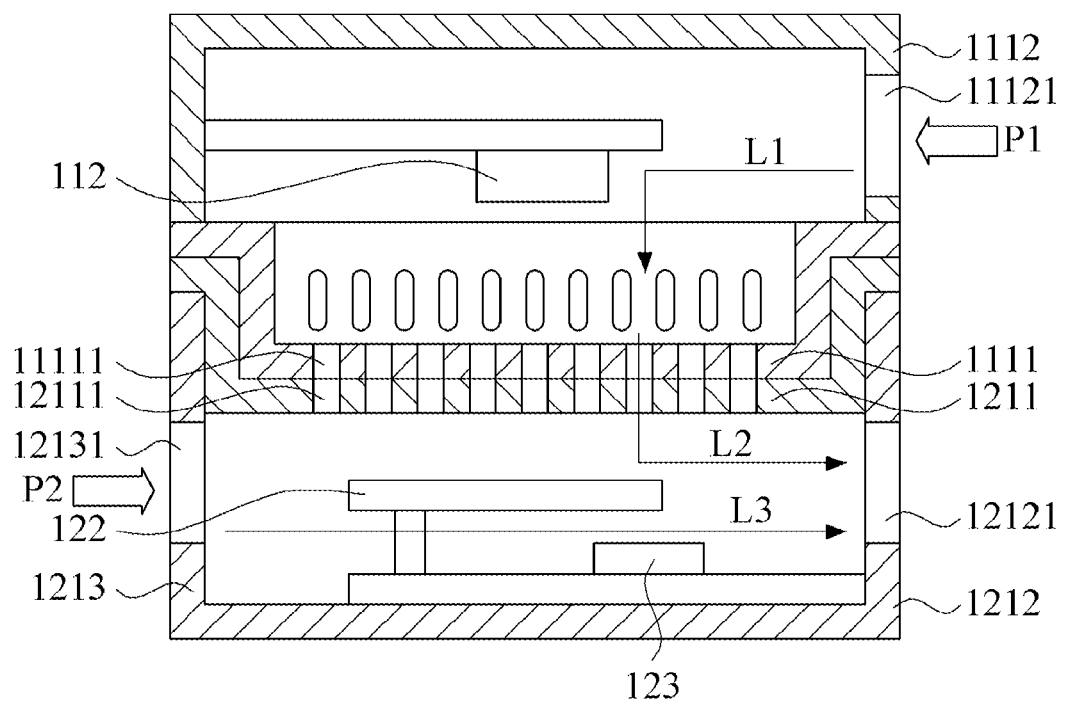
FIG. 3 is a cross-sectional view of FIG. 2 along line A-A.

Refer now to FIG. 1, FIG. 2 and FIG. 3, in which FIG. 1 is an exploded view at large of a first embodiment of the computer device with heat-dissipation channels in accordance with the present invention, FIG. 2 is a perspective view of FIG. 1, and FIG. 3 is a cross-sectional view of FIG. 2 along line A-A.

As shown, the first embodiment of the computer device with heat-dissipation channels 1 (or called the computer device with peripheral units 1) in accordance with the present invention includes a master unit 11 and at least one peripheral unit 12 (one shown in this embodiment).

The master unit 11 further includes a main case 111 and a first operation member 112. The main case 111 has at least one first connection surface 1111 and at least one first heat-dissipation surface 1112. In some other embodiments (not shown here), both the number of the first connection surface 1111 and the number of the first heat-dissipation surface 1112 can be plural. However, in this first embodiment of the present invention, each of the first connection surface 1111 and the first heat-dissipation surface 1112 is single existed.

The first connection surface 1111 is a bottom surface of the main case 111. However, in some other embodiments, the first connection surface can be any of the four lateral surfaces or the top surface of the main case 111. The first connection surface 1111 is structured to include at least one first hole 11111 (one labeled in the figure), and the first hole 11111 communicates with an external space (not labeled in the figure) through at least one first heat-dissipation channel L1 inside the main case 111.

The first heat-dissipation surface 1112 can be any lateral surface of the main case 111. However, in some other embodiments, the number of the first heat-dissipation surface can be plural, and each of which can be located to any relevant surface of the main case 111. In this embodiment, the first heat-dissipation surface 1112 is structured to include at least one third hole 11121 (one labeled in the figure). The third hole 11121 communicates with the first heat-dissipation channel L1. Namely, the third hole 11121 and the first hole 11111 are communicated in space with each other through the first heat-dissipation channel L1.

The first operation member 112 can be a central processing unit (CPU) located inside the main case 111. The first heat-dissipation channel L1 is extended over the first operation member 112, in which the first operation member 112 is usually electrically coupled with a circuit board (not labeled in the figure) so as to form a circuit board module. Hence, the first operation member 112 can be also directed to the circuit board module.

The peripheral unit 12 can be, but not limited to, a graphics processing unit (GPU). In some other embodiments, the peripheral unit 12 can be a hard disc or any other hi-performance device. In this embodiment, the peripheral unit 12 includes an peripheral-unit case 121, at least one fan 122 and a second operation member 123. The peripheral-unit case 121 has at least one second connection surface 1211, at least one second heat-dissipation surface 1212 and a third heat-dissipation surface 1213. In some other embodiments, the number for each the second connection surface 1211 or the second heat-dissipation surface 1212 can be plural. However, in this first embodiment, the number one is applied.

The second connection surface 1211 is shown to be, but not limited to, the top surface of the peripheral-unit case 121. The second connection surface 1211 has at least one second hole 12111 (one labeled in the figure), and the second hole 12111 communicates with the external space through the at least one second heat-dissipation channel L2 inside the peripheral-unit case 121.

The second heat-dissipation surface 1212 can be located at any lateral surface of the peripheral-unit case 121. In some other embodiments, the second heat-dissipation surface 1212 can be located to other surface and can be embodied in a plural number. The second heat-dissipation surface 1212 has at least one fourth hole 12121, and the fourth hole 12121 communicates with the second heat-dissipation channel L2. Namely, the fourth hole 12121 communicates with the second hole 12111 through the second heat-dissipation channel L2.

The third heat-dissipation surface 1213 is structured to include at least one fifth hole 12131 (one labeled in the figure), and the fifth hole 12131 communicates with the external space through the at least one third heat-dissipation channel L3 inside the peripheral-unit case 121. As shown, the third heat-dissipation channel L3 communicates with the fourth hole 12121. Namely, the fifth hole 12131 and the fourth hole 12121 are communicated in space to each other.

The fan 122 is located inside the peripheral-unit case 121 at a place in a midway of the second heat-dissipation channel L2, also by neighboring the third heat-dissipation channel L3. The second operation member 123 can be a graphics processing unit (GPU) located inside the peripheral-unit case 121 by neighboring the fan 122 so as to implement the fan 122 for cooling. Typically, the fan 122 is located above the second operation member 123.

In addition, a plurality of heat-dissipation fins (not shown herein) can be constructed inside the peripheral-unit case 121. These heat-dissipation fins can be constructed by protruding into the second heat-dissipation channel L2 by neighboring the fan 122 so as to enhance the heat dissipation efficiency.

In this first embodiment, when the peripheral unit 12 is stacked to the master unit 11 so as to have the first connection surface 1111 close to the second connection surface 1211, the first heat-dissipation channel L1, the first hole 11111, the second hole 12111 and the second heat-dissipation channel L2 are sequentially communicated in space and integrated as a whole to be a integrated heat-dissipation channel. While the fan 122 is operated, a first cooling airflow P1 flows through the integrated heat-dissipation channel, i.e. introduced from the external space, to the third hole 11121, further into the main case 111, through the first heat-dissipation channel L1, through the first hole 11111, through the second hole 12111, further through the second heat-dissipation channel L2 (by passing the heat-dissipation fins), and finally out to the external space via the fourth hole 12121.

In addition, while the fan 122 is operated, a second cooling airflow P2 is also to flow through the third heat-dissipation channels L3, i.e. introduced from the fifth hole 12131, through the third heat-dissipation channel L3 and finally out to the external space via the fourth hole 12121.

Figure 4:
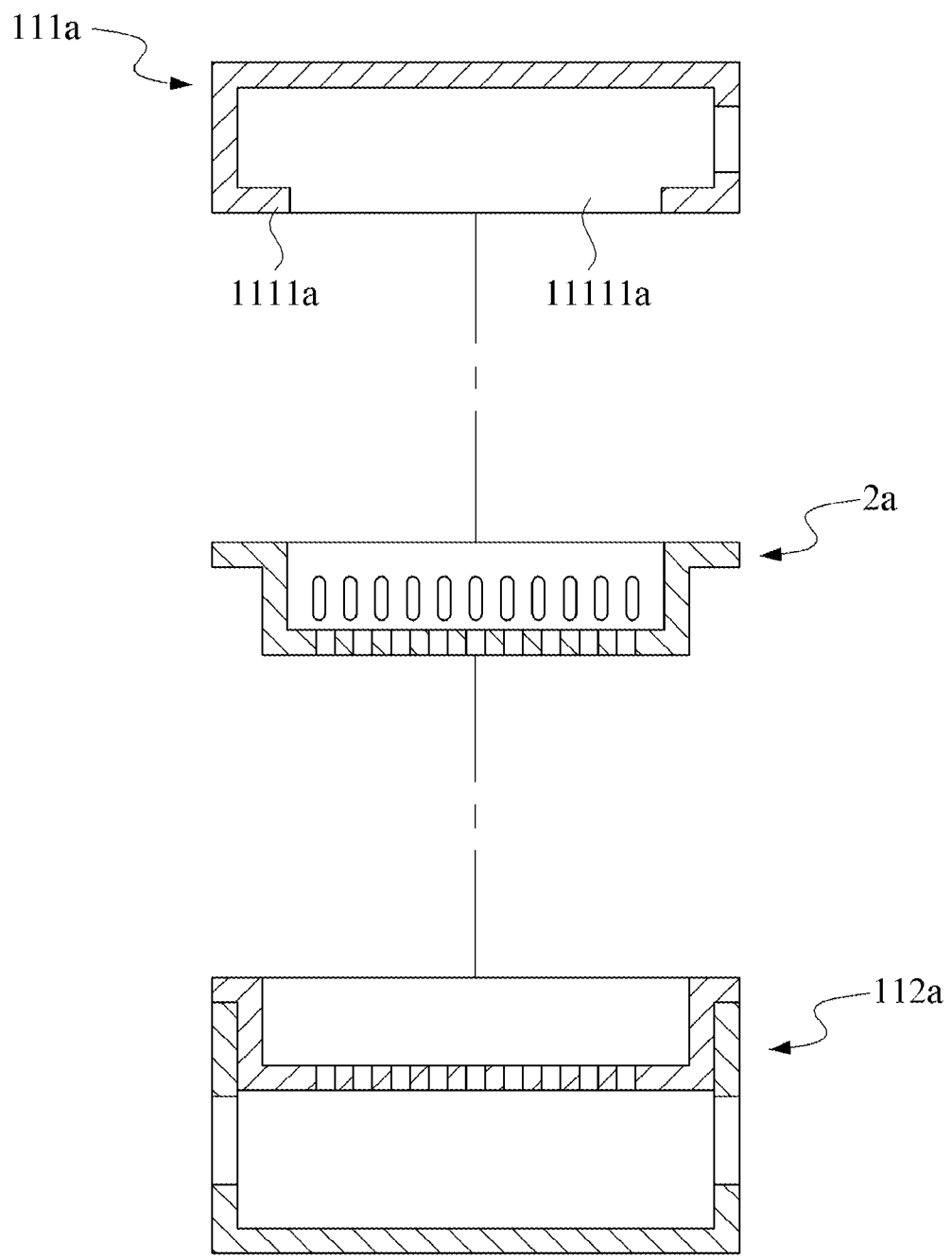
FIG. 4 is a schematic exploded cross-sectional view of a second embodiment of the computer device with heat-dissipation channels in accordance with the present invention.

Please refer to FIG. 4, in which a schematic exploded cross-sectional view of a second embodiment of the computer device with heat-dissipation channels in accordance with the present invention is shown. By comparing with the aforesaid first embodiment, the major difference in between is that, in this second embodiment, the first connection surface 1111a of the main case 111a is not a connected surface. In particular, a separable member 2a can be assembled to the bottom of the main case 111a in a separate manner. Normally, in the circumstance of not connecting a peripheral unit 112a, the separable member 2a is positioned in place at the bottom of the main case 111a. While it is a need to stack a peripheral unit 112a, the separable member 2a can be removed so as to form thereof a large-scaled first hole 11111a of the first connection surface 1111a. All other details of the second embodiment are resembled to those of the aforesaid first embodiment, and thus would be omitted herein.

In summary, by providing the computer device with heat-dissipation channels in accordance with the present invention, since the fan can drive the cooling airflow to flow through the integrated heat-dissipation channel so as to dissipate the first operation member and the second operation member. Thus, the master unit and the peripheral unit can be rapidly dissipated, and therefore the conventional heat-dissipation problem thereabout can be resolved. Also, since the fan can also produce another cooling airflow to flow through the third heat-dissipation channel and thus to further dissipate the second operation member, the heat-dissipation performance upon the peripheral unit can be further enhanced.

While the present invention has been particularly shown and described with reference to a preferred embodiment, it will be understood by those skilled in the art that various changes in form and detail may be without departing from the spirit and scope of the present invention.

What is claimed is:

1. A computer device with heat-dissipation channels, comprising:
    a master unit, further comprising:
        a main case, having at least one first connection surface, the first connection surface being disposed with at least one first hole, at least one first heat-dissipation channel inside the main case communicating with an external space through the first hole; and
        a first operation member, located inside the main case, the at least one first heat-dissipation channel being extended over the first operation member; and
    a peripheral unit, further comprising:
        an peripheral-unit case, having at least one second connection surface, the second connection surface being disposed with at least one second hole, at least one second heat-dissipation channel inside the peripheral-unit case communicating with the external space through the second hole; and
        at least one fan, located inside the peripheral-unit case at a place in a midway of the at least one second heat-dissipation channel;
    wherein, when the peripheral unit is assembled to the master unit such that the first connection surface is neighbored to the second connection surface, the at least one first heat-dissipation channel, the first hole, the second hole and the at least one second heat-dissipation channel sequentially communicate with each other to be integrated as an integrated heat-dissipation channel for a first cooling airflow driven by the fan to flow therethrough.

2. The computer device with heat-dissipation channels of claim 1, wherein the main case further has at least one first heat-dissipation surface, the first heat-dissipation surface being disposed with at least one third hole, the third hole communicating with the at least one first heat-dissipation channel.

3. The computer device with heat-dissipation channels of claim 2, wherein first heat-dissipation surface is a lateral surface of the main case and the first connection surface is a bottom surface of the main case.

4. The computer device with heat-dissipation channels of claim 1, wherein peripheral-unit case further has at least one second heat-dissipation surface, the second heat-dissipation surface including at least one fourth hole, the fourth hole being communicating with the at least one second heat-dissipation channel.

5. The computer device with heat-dissipation channels of claim 4, wherein second heat-dissipation surface is a lateral surface of the peripheral-unit case and the second connection surface is a top surface of the peripheral-unit case.

6. The computer device with heat-dissipation channels of claim 4, wherein peripheral-unit case further has a third heat-dissipation surface, the third heat-dissipation surface being disposed with at least one fifth hole, the fifth hole communicating with the external space through at least one third heat-dissipation channel inside the peripheral-unit case, the at least one third heat-dissipation channel communicating with the fourth hole, a second cooling airflow driven by the fan being to flow through the at least one third heat-dissipation channel.

7. The computer device with heat-dissipation channels of claim 1, wherein peripheral unit further has a second operation member located inside the peripheral-unit case by neighboring the fan, the first operation member is a central processing unit (CPU), and the second operation member is a graphics processing unit (GPU).

* * * * *